United States Patent
Surdeanu et al.

(10) Patent No.: US 7,521,323 B2
(45) Date of Patent: Apr. 21, 2009

(54) METHOD OF FABRICATING A DOUBLE GATE FIELD EFFECT TRANSISTOR DEVICE, AND SUCH A DOUBLE GATE FIELD EFFECT TRANSISTOR DEVICE

(75) Inventors: Radu Catalin Surdeanu, Leuven (BE); Youri Ponomarev, Leuven (BE)

(73) Assignee: NXP B.V., Eindhoven (NL)

( * ) Notice: Subject to any disclaimer, the term of this patent is extended or adjusted under 35 U.S.C. 154(b) by 428 days.

(21) Appl. No.: 10/570,478

(22) PCT Filed: Aug. 12, 2004

(86) PCT No.: PCT/IB2004/051454

§ 371 (c)(1),
(2), (4) Date: Mar. 1, 2006

(87) PCT Pub. No.: WO2005/022648

PCT Pub. Date: Mar. 10, 2005

(65) Prior Publication Data

US 2007/0166922 A1 Jul. 19, 2007

(30) Foreign Application Priority Data

Sep. 3, 2003 (EP) .................................. 03103279

(51) Int. Cl.
*H01L 21/336* (2006.01)
(52) U.S. Cl. .................. 438/283; 438/459; 257/401; 257/E21.442
(58) Field of Classification Search .................. 438/157, 438/283, 459, 532, 923; 257/365, 401, E21.442
See application file for complete search history.

(56) References Cited

U.S. PATENT DOCUMENTS

| 6,346,446 | B1 | 2/2002 | Ritenour |
| 6,504,173 | B2 | 1/2003 | Hsu et al. |
| 6,812,527 | B2 * | 11/2004 | Dennard et al. ............. 257/347 |
| 2002/0160574 | A1 | 10/2002 | Zahurak et al. |
| 2003/0040130 | A1 * | 2/2003 | Mayur et al. .................. 438/14 |

OTHER PUBLICATIONS

Murto R et al: "An Investigation of Species Dependence in Germanium Pre-Amorphized and Laser Thermal Annealed Ultra-Shallow Abrupt Junctions"; International Conference on Ion Implantation Technology Proceedings; Sep. 17, 2000; pp. 182-185.
Murto R et al: "Activation and Deactivation Studies of Laser Thermal . . ."; International Conference on Ion Implantation Technology Proceedings; Sep. 17, 2002; pp. 155-158.

* cited by examiner

*Primary Examiner*—Chandra Chaudhari
(74) *Attorney, Agent, or Firm*—Peter Zawilski

(57) ABSTRACT

The present invention discloses a method of forming a double gate field effect transistor device, and such a device formed with the method. One starts with a semiconductor-on-insulator substrate, and forms a first gate, source, drain and extensions, and prepares the second gate. Then the substrate is bonded to a second carrier, exposing a second side of the semiconductor layer. Next, an annealing step is performed as a diffusionless annealing, which has the advantage that the semiconductor layer not only has a substantially even thickness, but also has a substantially flat surface. This ensures the best possible annealing action of said annealing step. Very sharp abruptness of the extensions is achieved, with very high activation of the dopants.

9 Claims, 2 Drawing Sheets

METHOD OF FABRICATING A DOUBLE GATE FIELD EFFECT TRANSISTOR DEVICE, AND SUCH A DOUBLE GATE FIELD EFFECT TRANSISTOR DEVICE

The present invention relates to double gate transistor devices, in particular Metal-Oxide-Semiconductor Field Effect Transistors (MOSFETs) and Metal-Insulator-Semiconductor Field Effect Transistors (MISFETSs), and to a method of forming same.

The requirements set out in the International Roadmap for Semiconductors (ITRS) require smaller and smaller device dimensions, in particular the gate dimensions in normal (single gate) field effect transistor devices. In practice, it turns out that at very short gate lengths, say around 100 nm and less, it is very difficult to control deleterious effects such as the short channel effect. To solve this problem, a new kind of transistor device has been developed, with a double gate, in most cases on opposite sides of the channel. Since such double gate offers much more control over the channel, satisfactory transistor behaviour can be obtained for gate lengths down to 20 nm at present.

The use of such a double gate in transistor devices is known in the state of the art. For instance, U.S. Pat. No. 6,504,173 describes a dual gate FET and process, in which a silicon substrate is provided with a first gate region, two oxide regions that are to be adjacent to the channel of the gate, and a top oxide layer. This substrate is bonded to a handling wafer. After that, the second gate is formed in a number of steps. Subsequently, source and drain regions are implanted, and the total structure thus obtained is annealed.

However, in order to obtain the desired properties of the transistor device, it is very important that the annealing step is performed under optimum conditions. It turns out that in many cases the known method does not provide optimum characteristics, especially with respect to abruptness of the junction, in particular of the extension regions of the source and drain.

An object of the present invention is to provide a method of providing a double gate field effect transistor structure that allows the fabrication of very abrupt junctions, with an abruptness down to around 1 nm/decade.

The object is reached with a method according to claim 1. The invention is characterized in that a substrate having a double gate structure is obtained during the method, which substrate is subsequently annealed by means of a diffusionless annealing method. Note that at the moment of the annealing step the substrate has a substantially even total thickness, without any protruding gates, etched away portions etc. With such a substrate having an even thickness, it is possible to make optimum use of the properties of diffusionless annealing methods, such that they offer the desired abruptness of the junctions. For when the substrate has an even thickness, all parts of the substrate will be subjected to a substantially equal and well-controllable annealing action. The thermal budget, or thermal load, can be kept to a minimum since there are no parts of the semiconductor layer that protrude or would otherwise affect the thermal behaviour during anneal. Thus it is ensured that no part of the substrate will show diffused dopants or other undesired side effects.

The terms "substantially even/equal thickness" and "substantially flat" are to be construed as indicating that the semiconductor layer has a second surface, opposite the first surface, which is flat to within 5 nm over at least the area of the first gate structure and the corresponding extensions. This is opposed to the known method, in which at least the second gate protrudes from the surface of the substrate, and thus may give rise to thermal differences during annealing. Herein, use is made of the fact that in the method according to the invention there is a moment in which, after bonding to the second carrier and removing the first carrier and insulator layer, the exposed surface of the semiconductor is inherently flat. Please note that it is not necessary for the surface to remain substantially flat after the annealing step. Subsequent steps may alter the surface, by removing, depositing and/or patterning new layers or parts thereof. This will be elucidated further below.

Diffusionless annealing methods are understood to comprise those annealing methods that substantially do not diffuse dopants into surrounding layers, but keep the dopants that are to be activated in the intended parts of the semiconductor layer.

In a very advantageous embodiment, the substantially diffusionless annealing step is a laser thermal annealing step. Particularly in the case of a laser thermal anneal it is advantageous to have a substantially flat surface of the semiconductor layer. In that case there will be no shading of parts of the surface. Furthermore, there will be no protruding structures that will be heated up by the laser and that will in turn have influence on the heating up of the surrounding parts of the semiconductor. In particular, the absence of protruding structures on the flat semiconductor substrate allows even heating of said substrate, without having to supply too much energy to ensure that also the substrate parts that surround protruding parts to be heated to a sufficient annealing temperature, since this might overheat the parts further away from the protruding parts. This effect influences closely packed structures, such as highly integrated systems, even more than separate single structures.

In laser thermal anneal, use is made of the different properties of amorphous and crystalline semiconductor material. Amorphous silicon has a lower melting point and a higher absorption for laser light. Hence, it is possible to supply an amount of laser light sufficient to melt the amorphous layer, that however will not influence the surrounding crystalline layers. In the past, if there were protruding etc. structures, then it was either necessary or inevitable that in order to melt the complete amorphous layer, some surplus amount of energy had to be supplied, which meant degradation of the crystalline layers. The method of the invention successfully avoids this disadvantage.

It is to be noted that the same consideration in principle holds for any other geometry in which laser thermal annealing is to be used: it is advantageous to provide a flat geometry of the layer(s) to be annealed. After annealing, subsequent steps are allowed to change the flat surface. E.g. some self aligned depositing or etching step may deposit a layer or may form notches etc.

Preferably, in the step of forming the source and drain and the source and drain extensions, a disposable spacer process is used. In this process, known per se, first side wall spacers are deposited on the side walls of the first gate, according to any known process. This may be followed by depositing an inert layer. Then the source and drain regions are implanted with respective desired dopants. Subsequently the disposable spacers are removed. After that, an amorphization implant of the extension regions is performed, down to a desired depth, which is very shallow in the case of ultra shallow junctions. After the amorphization step, the extension regions are implanted. Next, the annealing step according to the invention may be carried out.

The (ultra shallow) junctions that can be formed with the method of the invention give the best known solution in terms of abruptness, both laterally and vertically, and activation, which is almost metal-like. The latter will result in a very low gate depletion and improved on-current with no increase of the off-current. In fact, in practice it is possible to achieve a value of up to 1E21 atoms/cm3 for the second gate, for both NMOS and PMOS devices. Furthermore, it is easy to tune the junctions in depth by appropriate amorphization of the layers, also called PAI or pr-amorphization implant.

Another advantage is that the gate is maintained in place, there is no deformation in this method.

In the method, the forming of the second gate in the second gate region may be is completed after annealing. This may for instance be performed by a self-aligned etching step of the heavily doped second gate region. It is known in the art that the etch rate of e.g. heavily doped silicon is much higher than that of undoped silicon. Hence a selective etch may leave a notch at the intended position of the second gate. After that, an electrically conducting material may be deposited, substantially filling the second gate. Subsequently, a planarization step to remove superfluous material may be performed, such as (chemical-) mechanical polishing.

However, it is also possible to carry out the step of etching the heavily doped second gate region, depositing a thin oxide layer and filling with e.g. an amorphous silicon material, followed by a planarization step. Then the next step may be the annealing step. This way, both the activation of the source, drain and extension and the activation of the second gate may be performed in a single annealing step, still with the advantages of a flat surface according to the invention. Additionally, if desired it is possible to form the second gate not as a structure within the semiconductor layer, but as a protruding structure. For after activating with a diffusionless annealing step it is not relevant to the method whether the surface remains flat or not.

An advantage of the method is that there is a perfect interface with the second gate, since no large grains polycrystalline structure is used at the interface with the second insulator.

In another advantageous embodiment of the method, the substantially diffusionless annealing step comprises solid phase epitaxy regrowth (SPER). SPER is a method known in the art. However, carried out in the method according to the invention it has similar advantages as described in connection with the laser thermal anneal method mentioned above.

Preferably, the temperature during solid phase epitaxy regrowth is between 500 and 800° C., and more preferably between 550 and 650° C. At these temperatures, SPER is a reasonably quick method, without running the risk of diffusion of dopants into surrounding layers.

The device also relates to a double gate field effect transistor device according to claim 5. Herein, the first gate structure and the second gate structure are provided on opposite sides of a channel of semiconductor material. As far as is known it has up to now been impossible to fabricate double gate FET devices with such high abruptness of the dopant profile of the junctions, in particular of the extensions. The advantages are obvious, in that e.g. a short channel effect may be controlled with higher precision, and that generally the transistor characteristics of the device are improved over known devices.

Preferably, an exposed surface of the semiconductor layer is substantially flat. Again, "substantially flat" means that the semiconductor layer has an exposed surface which is flat to within 5 nm over at least the area of the first gate structure and the corresponding extensions. In this way, a high-quality device with very small dimensions is provided. Optimum use is made of the advantage of a flat topography.

The invention will be understood more clearly after reading of the description of preferred embodiments, in connection with the appended drawing, in which.

Similar parts are denoted by the same reference numerals throughout the drawings. The drawings are schematic and not to scale.

Figure 1:
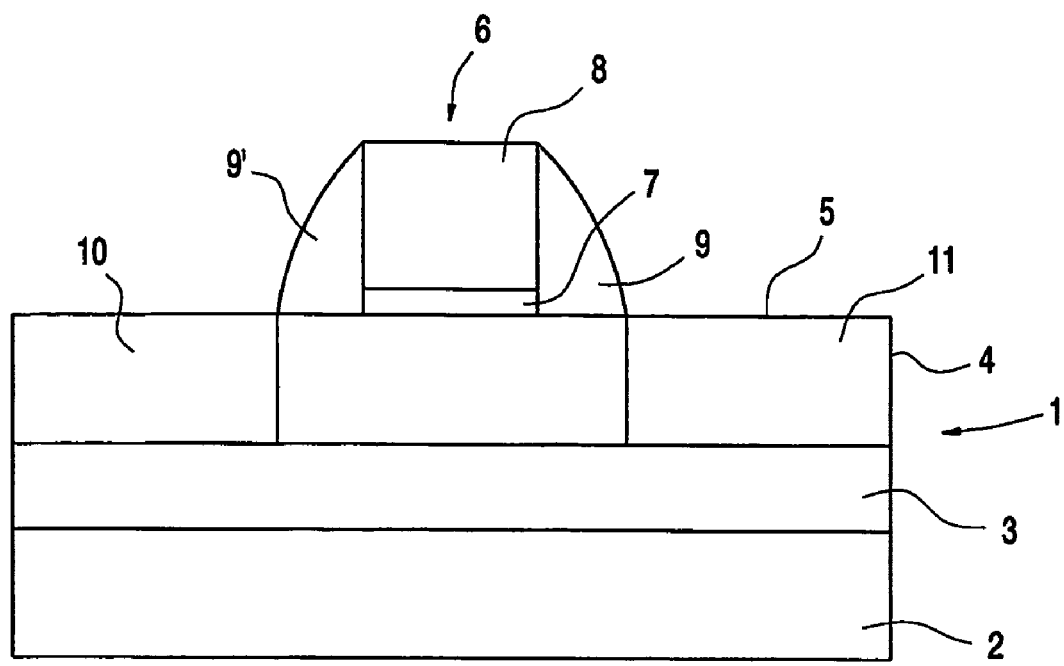
FIG. 1 shows a FET device in a first phase of the method, after forming of the source and drain regions.

In FIG. 1, a field effect transistor device 1 is shown in a first phase of the method according to the invention.

Herein, 2 denotes a first carrier layer, 3 is a first insulator layer, and 4 is a semiconductor layer with a first surface 5. A first gate structure is generally denoted 6, and comprises a first gate insulating layer 7 and a first gate electrode 8. Sidewall spacers 9 and 9' have been deposited on the sidewalls of the first gate 6. Source and drain regions are denoted 10 and 11, respectively.

The basis of the device 1 in the method according to the invention may consist of a first carrier layer 2 of e.g. silicon, onto which a first insulating layer 3 has been deposited, for instance silicon dioxide. Onto this layer 3, a thin (say around 100 nm) layer of semiconductor has been deposited. In most but not all cases the semiconductor is silicon. The combination of the three layers 2 through 4 is often referred to as Semiconductor on Insulator (SOI). The first insulating layer 3, which is often an oxide, is often referred to as Buried Oxide (BOX).

The first gate structure 6 may have been formed by any known method. Generally, the first gate structure 6 will have been formed by depositing a first gate insulating layer 7, e.g. an oxide or nitride or some other dielectric material, preferably with a high dielectric constant, followed by depositing a first gate electrode 8 in the form of e.g. (polycrystalline) silicon or any other suitable material. By means of known patterning techniques, the layers are patterned into the final first gate structure 6 as shown.

In a subsequent step, sidewall spacers 9, 9', have been deposited on the sidewalls of the first gate structure 6. Again, this may be carried out using any appropriate method known in the art. The goal of the sidewall spacers 9, 9', is to shield a part of the semiconductor layer 4 from dopant implanting when forming the source 10 and drain 11. Hereinafter, the source and drain will often be referred to in combination, for which the abbreviation S/D will be used. The S/D are formed by a pre-amorphization step, followed by a deep implant of the desired dopants, as is known in the art. The S/D occupy a thickness that is substantially equal to the thickness of the semiconductor layer 4.

Thus results the structure as shown in FIG. 1.

Figure 2:
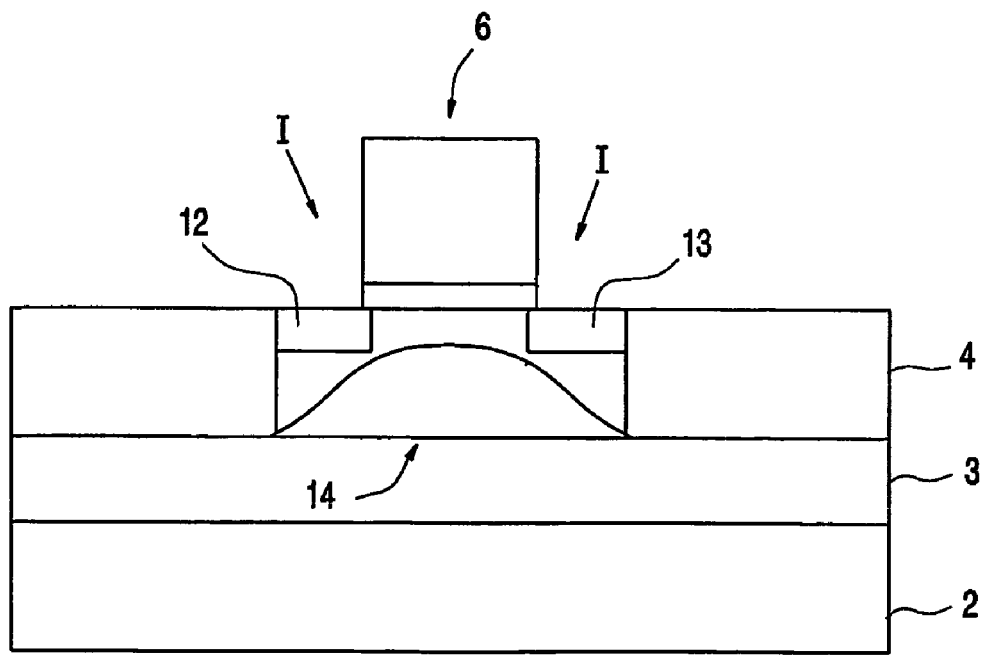
FIG. 2 shows the FET device of FIG. 1 in a second phase, after preparing of the second gate region.

FIG. 2 shows the FET device of FIG. 1 in a second phase, after preparing of the second gate region.

The device 1 now additionally comprises a source extension 12 and a drain extension 13. Arrows I and I' denote directions of implant beams.

A second gate region is denoted 14.

Starting from the device of FIG. 1, firstly the sidewall spacers 9, 9' have been removed, by means of etching or otherwise. Next, a pre-amorphization implant (PAI) is performed in order to amorphize the semiconductor layer 4 to a desired depth. Typically the PAI is carried out with germanium at a dose of between 5E14 and 1E15 atoms/cm2 at an energy of between 8 and 20 keV. However, other species, energies and doses may be used if desired, or required by the semiconductor material. Of course, the dose and energy are adapted to obtain amorphization to the desired depth. The PAI may be performed under an angle, as indicated by the arrows I for the drain and I' for the source. In most case, an angle will be between 0° and 45°.

Subsequently, the extensions are implanted with the desired dopants, e.g. boron, around 1E15 atoms/cm2 at energies of 0.5 keV, and arsenic, around 1E15 atoms/cm2 at energies of around 1 keV. Obviously, it is possible to choose other energies, doses and dopants, as the person skilled in the art will readily recognize. Note that no anneal is yet performed.

A next step is the preparation of the second gate region 14. Thereto it is e.g. possible to use an implanting step through the first gate structure 6. A high dose implant of dopants (again boron or arsenic) having such energies that the semiconductor layer 4 is implanted beneath the first gate structure 6 while leaving a thin part of layer 4 substantially undoped may be performed according to any known technique. The aim is to form a region 14 with such a high implant concentration that the properties of the resulting doped semiconductor material differ markedly from those of the undoped semiconductor. Examples are a different etching rate and a different low-temperature oxidization rate, which will be elucidated later. It is not necessary that the second gate structure 14 is finished in this phase of the method.

The resulting structure of the device is shown in FIG. 2.

Figure 3:
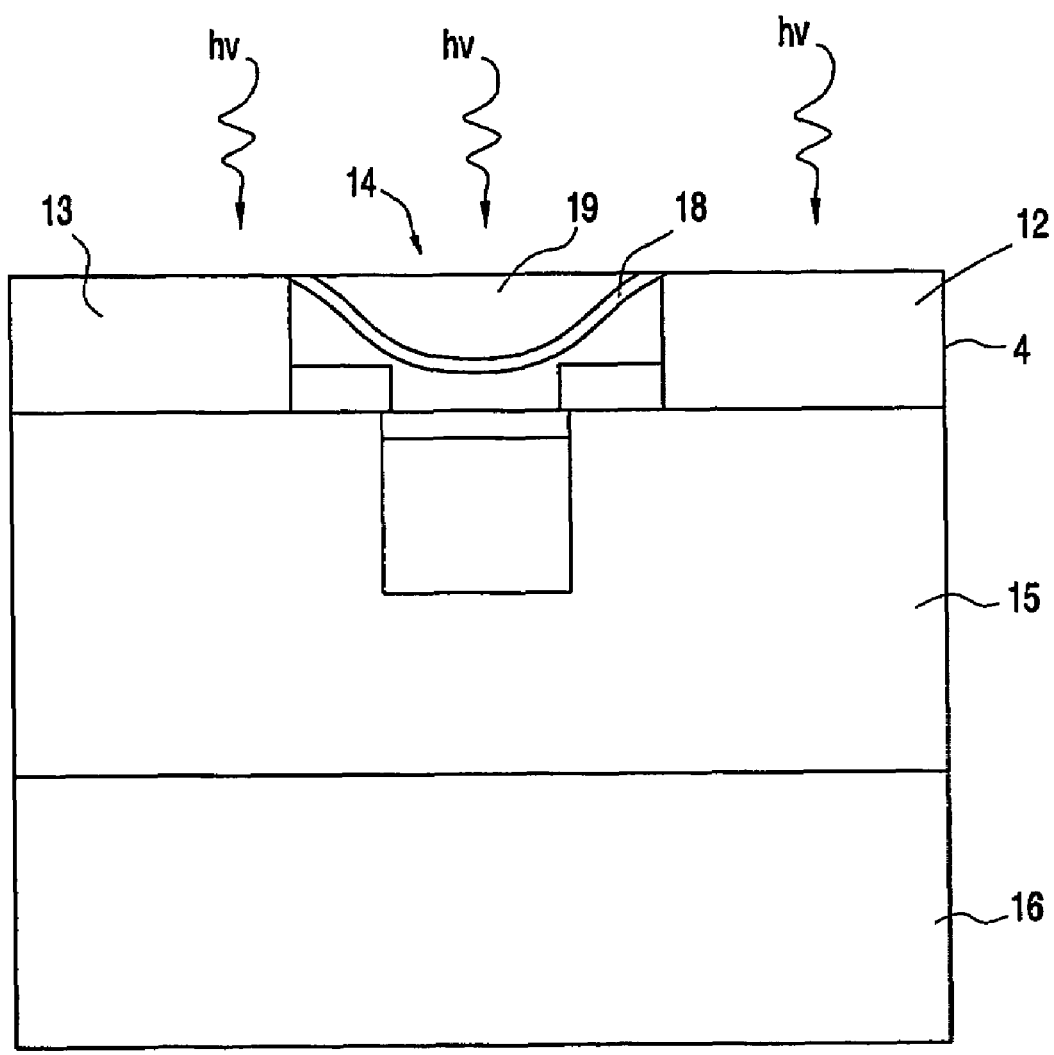
FIG. 3 shows the device of FIG. 2 in a third phase of the method, at the annealing step.

FIG. 3 shows the device of FIG. 2 in a third phase of the method, at the annealing step. Note that the device 1 has been rotated over 180° with respect to FIG. 2.

Herein, 15 denotes a second insulating layer and 16 is a second carrier layer. 17 is a second surface of the semiconductor layer 4.

The second gate region comprises a second gate insulating layer 18 and a second gate electrode 19.

The arrows hv indicate laser light.

The device 1 of FIG. 2 is shown in a next phase of the method. In this phase, a second insulating layer 15 has been deposited on top of the complete device 1, at the side of the first surface 5. The second insulating layer is e.g. a thick layer of silicon dioxide.

Next, the complete device, i.e. the SOI, has been bonded to a second carrier layer 16, for instance by gluing or any other method known to the person skilled in the art. The second carrier layer may be any type of material, but will preferably be a silicon wafer or glass.

After that, the first carrier layer and the first insulating layer are removed, again by any known method.

As a result, the semiconductor layer 4 with the first gate structure 4, the S/D 10, 11, the extensions 12, 13, and the second gate region 14 is rotated 180° with respect to the view of FIG. 2. The first surface 5 is now completely buried, and the second surface 17 opposite the first surface 5 is now exposed. It is to be noticed that the second surface 17 is completely flat, i.e. it has no topography.

Now there are two possibilities. One possibility is to first anneal and then finish the second gate 14, and the other possibility is to first finish the second gate 14 and then anneal. The latter possibility may be advantageous when use is made of amorphous material in the second gate, which subsequently needs activating.

As to the annealing, it is noted that at least the junctions, and in particular the extensions, are still amorphous. The implanted dopants need activating through annealing. A first method is shown in FIG. 3 in the form of laser thermal anneal, indicated by the arrows hv. For example, laser radiation with a wave length of 308 nm (XeCl excimer laser) is applied to the second surface 17 with a fluency of between 400 and 1000 mJ/cm2, depending on the depth of the junction, or generally the thickness of the semiconductor layer, and on the semiconductor material. Alternatively, any other kind of laser may be used as well, e.g. with wavelengths such as 532, 801 or 1064 nm. Of course, the laser intensity has to be selected accordingly, in order to allow for different absorption characteristics of the (amorphous) semiconductor material.

Due to the different laser absorption and different melting temperatures of the amorphous and the crystalline silicon material, the amorphous layers are melted and re-grown into crystalline layers. The dopants are thereby incorporated into the crystal lattice, and activated to a very high degree. A great advantage of this so-called laser thermal anneal is that it is substantially diffusionless. To be more precise, in this annealing method the dopants will not diffuse into surrounding layers. As a result, the junctions obtained are highly activated and extremely abrupt The abruptness of the profile may be as high as less than 2 nm/decade, preferably even down to about 1 nm/decade. This abruptness has never been possible in a double gate FET device.

In the case that first the second gate 14 is finished, and filled with amorphous silicon, which is subsequently doped, then the second gate electrode too will be highly activated.

The finishing of the second gate 14 may be executed by etching away the highly doped second gate region 14. Next, a second gate insulating layer 18 may be deposited, followed by filling with a second gate electrode material 19. A planarization step may be used. Another way of preparing the second gate and subsequently finishing it, uses the enhanced low-temperature oxidization of heavily doped silicon. The material thus obtained may be etched in a subsequent step, and filled with electrode material. This will however not be elucidated further.

In another method of annealing, according to the invention, a step of solid phase epitaxy regrowth or SPER is performed. By heating the device 1 to a sufficient temperature, the amorphous material starts to recrystallize, whereby the dopants are built into the regrown crystal lattice. Temperatures should be selected to be sufficiently low to prevent diffusion of the dopants. Preferred temperatures for SPER depend on the semiconductor material used, and for silicon these temperatures are between 500° C. and 800° C. The duration of the SPER step depends on the thickness of the amorphous layers, of the junction (extensions) and/or of the second gate 14, and also on the selected temperature. The person skilled in the art will easily select the appropriate duration on the basis of layer thickness and selected temperature. As with laser thermal anneal, by using SPER it is possible to prevent diffusion of dopants into surrounding layers. Hence it is possible to obtain very abrupt and highly activated junctions, with an abruptness of down to 1 nm/decade.

The device 1 as shown in FIG. 3 is now ready for the final production steps, which may be selected as desired, for instance silicidization etc. This will however not be elucidated further.

The present invention has been illustrated by means of preferred embodiments shown in the drawings. However, the invention is not to be construed as limited thereby. The scope of the invention is determined by the appended claims.

The invention claimed is:

1. Method of fabricating a double gate field effect transistor device with ultra shallow junctions, comprising the steps of
providing a substrate having a first carrier layer, a first insulator layer and a semiconductor layer;
forming a first gate structure on a first surface of the semiconductor layer, forming a source and a drain, and a source extension and a drain extension in said semiconductor layer, using an amorphization step, preparing a second gate region by a through-the-first-gate-implant process, depositing a second insulator layer over the whole of the substrate at the first surface thereof, bonding the substrate to a second carrier layer, removing the first carrier layer and the first insulator layer, wherein subsequently a step of activating at least the source extension and the drain extension is performed with a substantially diffusionless annealing step.

2. Method according to claim 1, wherein the substantially diffusionless annealing step is a laser thermal annealing step.

3. Method according to claim 1, wherein the substantially diffusionless annealing step comprises solid phase epitaxy regrowth.

4. Method according to claim 3, wherein the temperature during solid phase epitaxy regrowth is between 550 and 650° C.

5. Double gate field effect transistor device, comprising a semiconductor layer with a first gate structure and a second gate structure, a source and a drain, a source extension and a drain extension in contact with the first and second gate structures, wherein an abruptness of a dopant profile of the source extension and drain extension is better than 2 nm/decade, the device obtainable by a method according to claim 1.

6. Device according to claim 5, wherein an exposed surface of the semiconductor layer is substantially flat.

7. Device according to claim 5, wherein the abruptness of the dopant profile of the source extension and drain extension is not greater than about 1 nm/decade.

8. Device according to claim 5, wherein an exposed surface of the semiconductor layer is not substantially flat.

9. Device according to claim 5, wherein the second gate structure is not within the semiconductor layer but rather protrudes from the semiconductor layer.

* * * * *